(12) United States Patent
Katsuda

(10) Patent No.: US 9,661,762 B2
(45) Date of Patent: May 23, 2017

(54) PRINTED WIRING BOARD

(71) Applicant: IBIDEN CO., LTD., Ogaki (JP)

(72) Inventor: Naoki Katsuda, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 14/533,329

(22) Filed: Nov. 5, 2014

(65) Prior Publication Data
US 2015/0122530 A1 May 7, 2015

(30) Foreign Application Priority Data

Nov. 5, 2013 (JP) ................................. 2013-229513

(51) Int. Cl.
H05K 1/02 (2006.01)
H05K 3/46 (2006.01)
H05K 1/03 (2006.01)

(52) U.S. Cl.
CPC ......... *H05K 3/4688* (2013.01); *H05K 1/0271* (2013.01); *H05K 1/0366* (2013.01); *H05K 3/4602* (2013.01)

(58) Field of Classification Search
CPC ............... H05K 1/02; H05K 1/03; H05K 1/11
USPC ......................................................... 174/251
See application file for complete search history.

(56) References Cited

U.S. PATENT DOCUMENTS

| | | | | |
|---|---|---|---|---|
| 2009/0126974 A1* | 5/2009 | Yuasa | ................... | B29C 70/506 174/250 |
| 2009/0218672 A1* | 9/2009 | Nakamura | .............. | B32B 27/12 257/690 |
| 2011/0203835 A1* | 8/2011 | Yamamoto | ................ | H01F 1/26 174/250 |
| 2011/0253422 A1* | 10/2011 | Muramatsu | .............. | H05K 3/28 174/251 |
| 2011/0297423 A1 | 12/2011 | Noh et al. | | |
| 2012/0085572 A1* | 4/2012 | Sakai | ...................... | H01L 24/24 174/258 |
| 2013/0048345 A1* | 2/2013 | Masuda | ............... | H05K 3/4626 174/251 |

(Continued)

FOREIGN PATENT DOCUMENTS

JP 11-135676 A 5/1999

*Primary Examiner* — Hoa C Nguyen
*Assistant Examiner* — Stanley Tso
(74) *Attorney, Agent, or Firm* — Oblon, McClelland, Maier & Neustadt, L.L.P.

(57) ABSTRACT

A printed wiring board includes a core substrate including a resin insulating layer and multiple conductor layers, a first wiring structure formed on a first surface of the core substrate and including a conductor layer and a resin insulating layer, and a second wiring structure formed on a second surface of the core substrate and including a conductor layer and a resin insulating layer. The core substrate is interposed between the first wiring structure and the second wiring structure such that the resin insulating layers and conductor layers in the core substrate, first wiring structure and second wiring structure are alternately laminated, the resin insulating layer in the first wiring structure has a vol % of resin which is larger than a vol % of resin in the resin insulating layer in the second wiring structure such that a difference in the vol % of resin in the first and second wiring structures is in the range of from 0.5% to 5.0%.

20 Claims, 5 Drawing Sheets

(56) References Cited

U.S. PATENT DOCUMENTS

| | | | | |
|---|---|---|---|---|
| 2013/0105200 A1* | 5/2013 | Ohigashi | ................... | C08J 5/24 |
| | | | | 174/250 |
| 2013/0221518 A1* | 8/2013 | Ishida | .................. | H05K 1/0298 |
| | | | | 257/737 |
| 2014/0158406 A1* | 6/2014 | Kato | ..................... | H05K 1/024 |
| | | | | 174/250 |

* cited by examiner

Photograph of glass fibers that form a prepreg

PRINTED WIRING BOARD

CROSS-REFERENCE TO RELATED APPLICATIONS

The present application is based upon and claims the benefit of priority to Japanese Patent Application No. 2013-229513, filed Nov. 5, 2013, the entire contents of which are incorporated herein by reference.

BACKGROUND OF THE INVENTION

Field of the Invention

The present invention relates to a printed wiring board that has an upper wiring part, a lower wiring part, and a middle wiring part that is sandwiched by the upper wiring part and the lower wiring part.

Description of Background Art

In U.S. Patent Application Publication No. 2011/0297423 A1, a height of a bump on an outer side is made higher than a height of a bump on an inner side. In Japanese Patent Laid-Open Publication No. HIE 11-135676, a ratio of a metal part on an IC chip side and a ratio of a metal part on a motherboard side are adjusted. Specifically, in Japanese Patent Laid-Open Publication No. HIE 11-135676, between conductor circuits that are formed on the side where the IC chip is mounted, a dummy pattern is formed. The entire contents of these publications are incorporated herein by reference.

SUMMARY OF THE INVENTION

According to one aspect of the present invention, a printed wiring board includes a core substrate including a resin insulating layer and multiple conductor layers, a first wiring structure formed on a first surface of the core substrate and including a conductor layer and a resin insulating layer, and a second wiring structure formed on a second surface of the core substrate and including a conductor layer and a resin insulating layer. The core substrate is interposed between the first wiring structure and the second wiring structure such that the resin insulating layers and conductor layers in the core substrate, first wiring structure and second wiring structure are alternately laminated, the resin insulating layer in the first wiring structure has a vol % of resin which is larger than a vol % of resin in the resin insulating layer in the second wiring structure such that a difference in the vol % of resin in the first and second wiring structures is in the range of from 0.5% to 5.0%.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
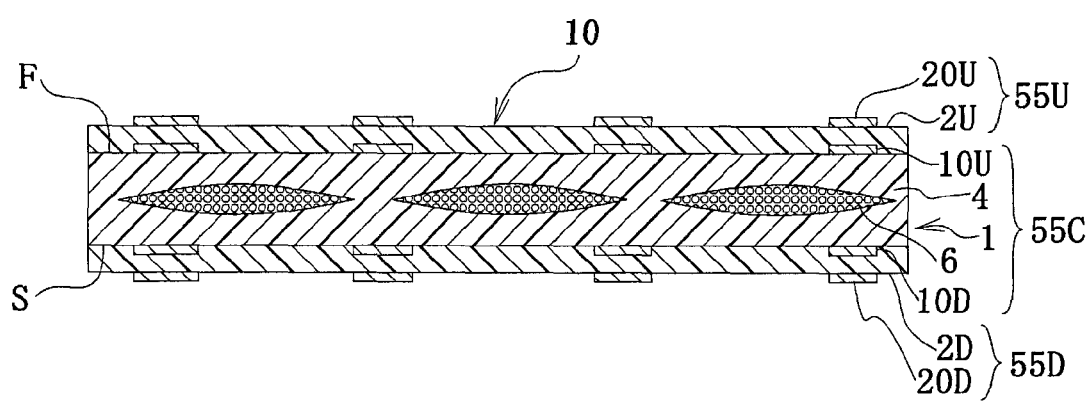
FIG. 1 illustrates a cross-sectional view of a printed wiring board of a first embodiment.

The embodiments will now be described with reference to the accompanying drawings, wherein like reference numerals designate corresponding or identical elements throughout the various drawings.

First Embodiment

In a cross-sectional view illustrated in FIG. 1, a reference numeral 1 indicates a core substrate that has an insulating base material 4 as a middle resin insulating layer. For example, the insulating base material 4 is a glass epoxy substrate, and the core substrate 1 is a double-side substrate. The insulating base material 4 has a glass cloth 6 as a reinforcing material. The insulating base material 4 has a thickness of ranging from 0.1 mm to 0.25 mm. Warpage can be controlled by a difference in vol % of resin. The insulating base material 4 has a first surface (F) and a second surface (S) that is on an opposite side of the first surface (F). The core substrate 1 also has a first surface (F) and a second surface (S). The first surface (F) of the core substrate 1 and the first surface (F) of the insulating base material 4 are the same surface; and the second surface (S) of the core substrate 1 and the second surface (S) of the insulating base material 4 are the same surface. The core substrate 1 has a first conductor layer (10U) on the first surface (F) of the insulating base material 4 and has a second conductor layer (10D) on the second surface (S) of the insulating base material 4. In the first embodiment, the first conductor layer is a second middle conductor layer (10U); the insulating base material 4 is a middle resin insulating layer; and the second conductor layer is a first middle conductor layer (10D). The core substrate 1 is a middle wiring part (55C). The core substrate 1 may be manufactured, for example, using a method described in U.S. Pat. No. 7,786,390. The entire contents of U.S. Pat. No. 7,786,390 are incorporated herein by reference.

An upper resin insulating layer (uppermost resin insulating layer) (2U) is formed on the first surface (F) of the core substrate 1, and further, an upper conductor layer (20U) is formed on the upper resin insulating layer (2U). An upper wiring part (55U) is formed by the upper resin insulating layer (2U) and the upper conductor layer (20U). The upper resin insulating layer (2U) contains a thermosetting resin such as epoxy, and inorganic particles such as silica. The upper resin insulating layer (2U) may further contain a reinforcing material such as a glass cloth.

A lower resin insulating layer (lowermost resin insulating layer) (2D) is formed on the second surface (S) of the core substrate 1, and further, a lower conductor layer (20D) is formed on the lower resin insulating layer (2D). A lower wiring part (55D) is formed by the lower resin insulating layer (2D) and the lower conductor layer (20D). The lower resin insulating layer (2D) contains a thermosetting resin such as epoxy, and inorganic particles such as silica. The lower resin insulating layer (2D) may further contain a reinforcing material such as a glass cloth.

The upper wiring part (55U) and the lower wiring part (55D) that are formed on the core substrate 1 are formed using a well-known semi-additive method. The semi-additive method is described, for example, in Japanese Patent Laid-Open Publication No. 2001-135931.

A printed wiring board of the first embodiment is formed by the middle wiring part (55C), and the upper wiring part (55U) and the lower wiring part (55D) that sandwich the middle wiring part (55C). One resin insulating layer belongs to each of the wiring parts. Therefore, in the first embodiment, with the core substrate 1 at the middle, the resin insulating layers and the conductor layers are symmetrically formed above and below the core substrate 1. Further, in the first embodiment, the upper conductor layer (20U) is an uppermost conductor layer, and the lower conductor layer (20D) is a lowermost conductor layer. Therefore, in the first embodiment, the four conductor layers and the three resin insulating layers are alternately laminated.

A volume of resin contained in the upper resin insulating layer (2U) is larger than a volume of resin contained in the lower resin insulating layer (2D). A difference between the volume of the resin contained in the upper resin insulating layer (2U) and the volume of the resin contained in the lower resin insulating layer (2D) is 0.5 vol %-5.0 vol %. For example, when a thickness of the upper resin insulating layer (2U) and a thickness of the lower resin insulating layer (2D) are the same, by changing an amount of inorganic particles and an amount of a reinforcing material other than the resin, the vol % of the resin in the upper resin insulating layer (2U) and the vol % of the resin in the lower resin insulating layer (2D) are adjusted. When the amounts of the inorganic particles and the reinforcing material other than the resin contained in the upper resin insulating layer (2U) and the amounts of the inorganic particles and the reinforcing material other than the resin contained in the lower resin insulating layer (2D) are the same, by changing the thickness of the upper resin insulating layer (2U) and the thickness of the lower resin insulating layer (2D), the vol % of the resin in the upper resin insulating layer (2U) and the vol % of the resin in the lower resin insulating layer (2D) are adjusted. It is preferable that the upper resin insulating layer (2U) and the lower resin insulating layer (2D) have the same reinforcing material and that the thickness of the upper resin insulating layer (2U) is larger than the thickness of the lower resin insulating layer (2D).

By making the vol % of the resin in the upper resin insulating layer (2U) larger than the vol % of the resin in the lower resin insulating layer (2D), a coefficient of thermal expansion (CTE) of the upper resin insulating layer (2U) becomes larger than a coefficient of thermal expansion (CTE) of the lower resin insulating layer (2D). Here, the CTE is a value in an X-Y direction. An X-Y plane is a plane that is substantially parallel to the first surface (F) and the second surface (S) of the core substrate 1. Further, the CTE is a value of α1.

Figure 2A:
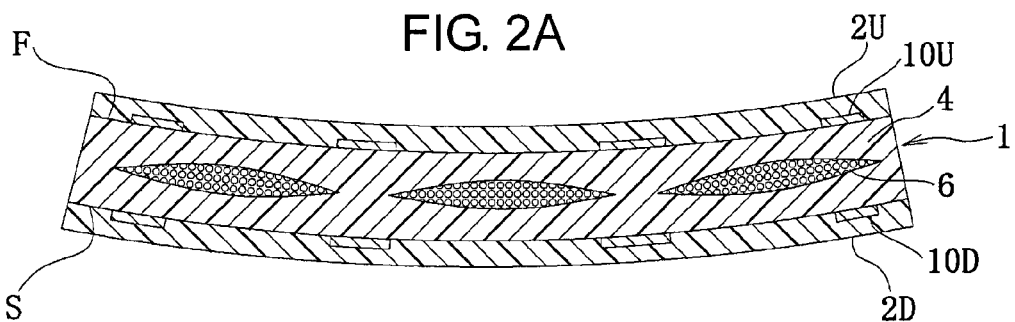
FIGS. 2A and 2B illustrate warpage of an intermediate printed wiring board prior to completion of a printed wiring board of the first embodiment.

The upper and lower resin insulating layers (2U, 2D) are laminated on both sides of the core substrate 1 by heat pressing. Since the resin insulating layers (2U, 2D) are laminated by heat pressing, an intermediate printed wiring board at the time has no warpage, or the warpage is small. Thereafter, the intermediate printed wiring board returns to normal temperature. Since the CTE of the upper resin insulating layer (2U) is larger than the CTE of the lower resin insulating layer (2D), the intermediate printed wiring board warps as illustrated in FIG. 2A. In FIG. 2A, the resin insulating layer (2U) that belongs to the upper wiring part (55U) is illustrated on an upper side. When the printed wiring board illustrated in FIG. 2A is placed on a flat surface (MS), a substantially center of the printed wiring board is in contact with the flat surface, and an outer periphery of the printed wiring board floats from the flat surface. Such a warpage is referred to as a concave warpage. A reverse warpage (FIG. 2B) is referred to as a convex warpage.

After the upper and lower resin insulating layers (2U, 2D) are formed, the conductor layers (20U, 20D) are formed on the resin insulating layers (2U, 2D). Thereby, a printed wiring board 10 of the first embodiment is completed (FIG. 1). In FIG. 1, the warpage is omitted. At the normal temperature, the printed wiring board of the first embodiment and the above-described intermediate printed wiring board have the same warpage.

In the printed wiring board of the first embodiment, the CTE of the resin insulating layer (2U) that belongs to the upper wiring part (55U) is larger than the CTE of the resin insulating layer (2D) that belongs to the lower wiring part (55D). Even when a large number of the printed wiring boards of the first embodiment are manufactured, due to the difference in the CTE, warpages of the printed wiring boards are in the same direction. Further, since the difference between the resin amount (vol %) in the upper resin insulating layer (2U) and the resin amount (vol %) in the lower resin insulating layer (2D) is small, a warpage amount (CA) of the printed wiring board is small. The warpage amount (CA) is illustrated in FIGS. 2C and 2D.

Even when a printed wiring board is manufactured with flatness as a goal, in manufacturing a large number of printed wiring boards, printed wiring boards having concave warpages and printed wiring boards having convex warpages are manufactured. However, according to the printed wiring board of the first embodiment, the warpage of the printed wiring board is controlled by the difference in the resin amount (vol %). Therefore, even when a large number of printed wiring boards are manufactured, shapes of warpages of the printed wiring boards are likely to be the same. The shapes of the warpages are concave warpages or convex warpages.

Solder bumps for mounting an IC chip and solder bumps for connecting to a motherboard are formed on a printed wiring board. When warpage amounts and shapes of the warpages of the printed wiring boards are the same, conditions for forming the solder bumps can be easily set. Therefore, heights of the solder bumps of the printed wiring boards and heights of the solder bumps within one printed wiring board become uniform. Connection reliability between the printed wiring board of the first embodiment and an IC chip and connection reliability between the printed wiring board of the first embodiment and a motherboard are improved.

An electronic component such as an IC chip is mounted by reflow on the printed wiring board of the first embodiment illustrated in FIG. 1. The IC chip is mounted on the upper wiring part (55U).

Due to the reflow, temperature of the printed wiring board of the first embodiment is high. The reflow temperature is higher than a temperature for laminating the resin insulating layer. Further, the resin amount (vol %) of the upper resin insulating layer (2U) is larger than the resin amount (vol %) of the lower resin insulating layer (2D). Therefore, at a mounting temperature, an expansion amount of the upper resin insulating layer (2U) is larger than an expansion amount of the lower resin insulating layer (2D). Therefore, when the IC chip is mounted, the shape of the warpage of the printed wiring board of the first embodiment is a convex warpage. According to the first embodiment, the shapes of the warpages of the printed wiring boards are likely to be the same during mounting. Therefore, electronic components can be easily mounted on the printed wiring boards.

Figure 2B:
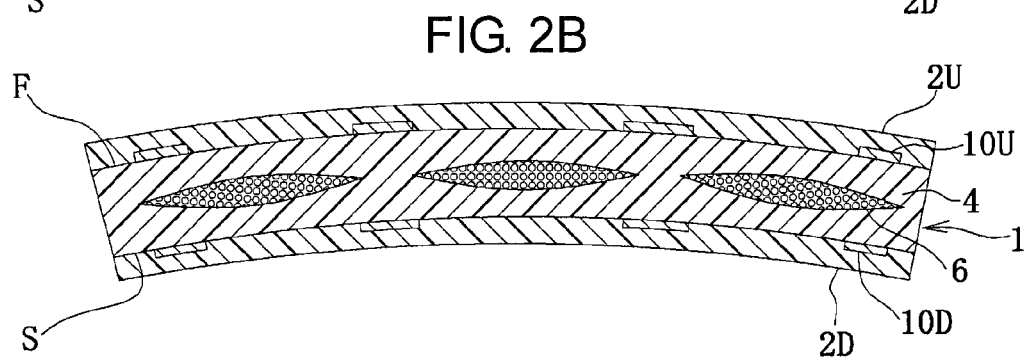
Figure 2C:
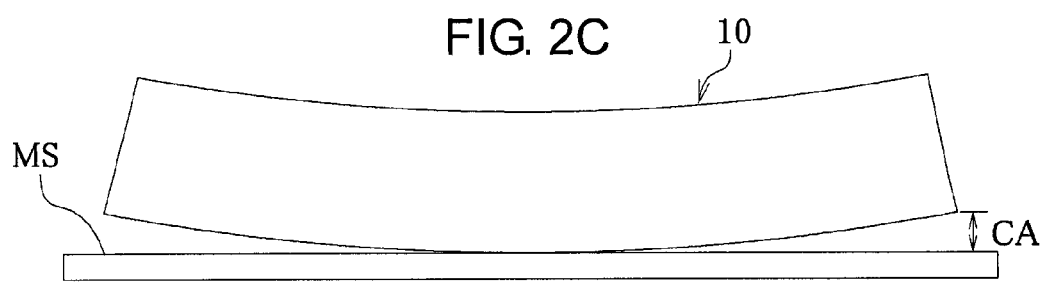
FIGS. 2C and 2D illustrate a warpage amount of the printed wiring board of the first embodiment.
Figure 2D:
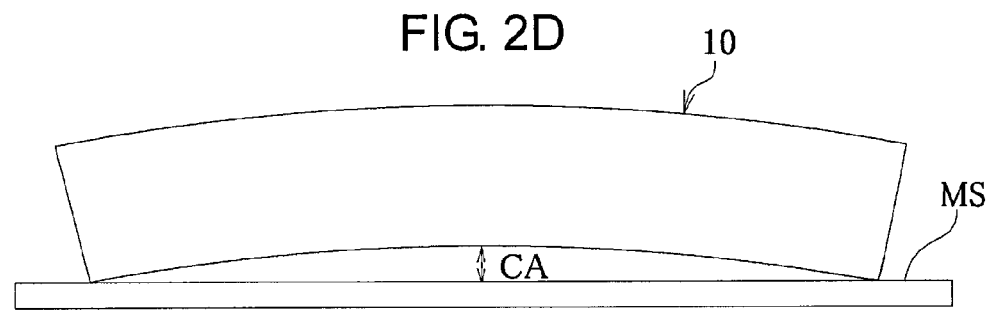

In a convex warpage as illustrated in FIG. 2B, an electronic component such as an IC chip is mounted on the printed wiring board. Therefore, a length of a solder bump that connects an electrode on an outer periphery of the electronic component and a pad on an outer periphery of the printed wiring board becomes longer. Connection reliability between the electronic component and the printed wiring board is improved.

When the difference in the resin amount between the upper resin insulating layer (2U) and the lower resin insulating layer (2D) is in a range from 0.5 vol % to 5.0 vol %, the direction of the warpage and the amount of the warpage are controlled. When the difference in the resin amount is less than 0.5 vol %, the shape of the warpage is not controlled. For example, when 100 printed wiring boards are manufactured, at the normal temperature, 90 printed wiring boards have concave warpages, and 10 printed wiring boards have convex warpages or are flat printed wiring boards. When the difference in the resin amount exceeds 5 vol %, the warpage amount of the printed wiring board during mounting becomes large. Therefore, a distance between the electrode on the outer periphery of the electronic component and the printed wiring board becomes too large. Non-connection occurs. Or, disconnection occurs between the printed wiring board and the electronic component in a heat cycle.

When an electronic component such as an IC chip is mounted on the printed wiring board, the warpage of the printed wiring board of the embodiment at the normal temperature is small.

The CTE of the electronic component such as the IC chip is smaller than the CTE of the printed wiring board and the CTE of the lower resin insulating layer. Therefore, the difference in the CTE that is caused by the difference between the resin amount (vol %) of the upper resin insulating layer (2U) and the resin amount (vol %) of the lower resin insulating layer (2D) is relaxed. This is because the upper resin insulating layer that has a larger CTE is positioned between the IC chip that has a smaller CTE and the lower resin insulating layer that has a smaller CTE.

The printed wiring board of the first embodiment on which an electronic component such as an IC chip is mounted (an application example of the embodiment) is mounted on a motherboard via the lower wiring part (55D) by reflow. In this case, temperature of the application example of the embodiment is high. However, since the upper resin insulating layer (2U) is formed between the IC chip and the lower resin insulating layer (2D), expansion of upper resin insulating layer (2U) is suppressed. Therefore, the warpage amount of the application example of the embodiment at the reflow temperature becomes smaller. Since a size of the printed wiring board is larger than a size of the electronic component such as the IC chip, when the warpage is large, it is difficult to mount the application example of the embodiment on the motherboard. However, in the first embodiment, the resin amount (vol %) of the upper resin insulating layer (2U) is larger than the resin amount (vol %) of the lower resin insulating layer (2D). Therefore, the application example of the embodiment can be easily mounted on the motherboard. Further, the connection reliability between the application example of the embodiment and the motherboard is improved.

Second Embodiment

Figure 3:
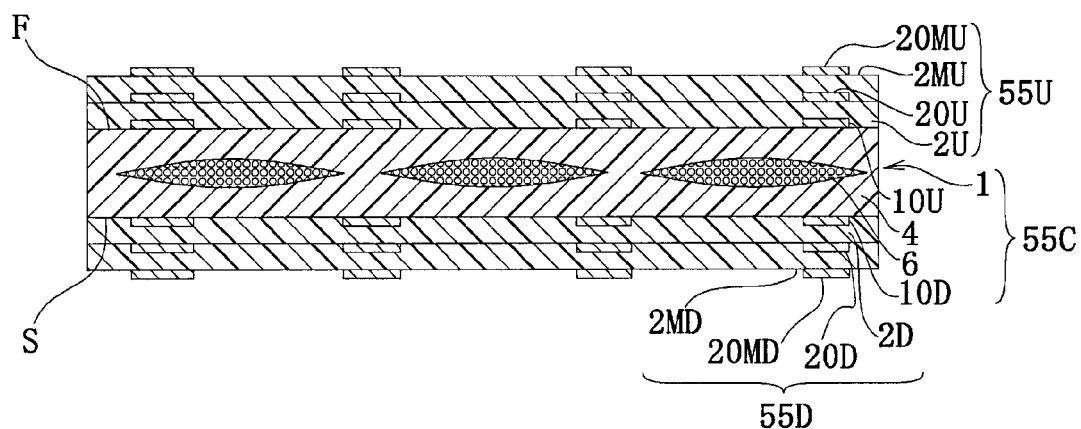
FIG. 3 illustrates a cross-sectional view of a printed wiring board of a second embodiment.

A printed wiring board of a second embodiment is illustrated in FIG. 3. The printed wiring board of the second embodiment further has an uppermost resin insulating layer (2MU) that is formed on the upper wiring part (55U) of the printed wiring board of the first embodiment, and an uppermost conductor layer (20MU) that is formed on the uppermost resin insulating layer (2MU). The upper wiring part (55U) is formed by the upper resin insulating layer (2U), the upper conductor layer (20U), the uppermost resin insulating layer (2MU) and the uppermost conductor layer (20MU). Further, the printed wiring board of the second embodiment has a lowermost resin insulating layer (2MD) that is formed on the lower wiring part (55D) of the printed wiring board of the first embodiment, and a lowermost conductor layer (20MD) that is formed on the lowermost resin insulating layer (2MD). The lower wiring part (55D) is formed by the lower resin insulating layer (2D), the lower conductor layer (20D), the lowermost resin insulating layer (2MD) and the lowermost conductor layer (20MD).

Resin amounts (vol %) of the uppermost and lowermost resin insulating layers (2MU, 2MD) are substantially the same as the resin amount (vol %) of the lower resin insulating layer (2D). In the second embodiment, the two resin insulating layers (2U, 2MU) and the two conductor layers (20U, 20MU) are alternately laminated on the first surface (F) of the core substrate 1. Further, the two resin insulating layers (2D, 2MD) and the two conductor layers (20D, 20MD) are alternately laminated on the second surface (S) of the core substrate 1.

In the second embodiment, due to the resin amounts in the resin insulating layers, a value of the CTE of the upper resin insulating layer (2U) is larger than values of the CTE of the lower resin insulating layer (2D), the CTE of the uppermost resin insulating layer (2MU) and the CTE of the lowermost resin insulating layer (2MD). Therefore, a shape of warpage of the printed wiring board of the second embodiment at the normal temperature is the same as the shape of the warpage of the printed wiring board of the first embodiment at the normal temperature. The shape of the warpage when an electronic component such as a semiconductor element is mounted is also the same for the printed wiring board of the second embodiment and the printed wiring board of the first embodiment.

At the normal temperature, the warpage amount of the application example of the printed wiring board of the first embodiment and the warpage amount of an application example of the printed wiring board of the second embodiment are the same. Similar to the first embodiment, the warpage amount of the printed wiring board of the second embodiment on which the electronic component is mounted is smaller than the warpage amount of the printed wiring board of the second embodiment before the electronic component is mounted. The printed wiring board of the second embodiment on which the electronic component is mounted is the application example of the printed wiring board of the second embodiment.

When the application example is mounted on a motherboard by reflow, the warpage amount of the application example of the printed wiring board of the first embodiment and the warpage amount of the application example of the printed wiring board of the second embodiment are the same. Similar to the first embodiment, the warpage amount of the application example of the printed wiring board of the second embodiment at the reflow temperature is smaller than the warpage amount of the printed wiring board (the printed wiring board on which the electronic component such as the semiconductor element is not mounted) of the second embodiment at the reflow temperature.

The upper resin insulating layer (2U) that has a relatively large coefficient of thermal expansion is covered by the uppermost resin insulating layer (2MU) that has a relatively smaller coefficient of thermal expansion. Therefore, a distance between the upper resin insulating layer (2U) and a center of gravity of the printed wiring board is smaller than a distance between the uppermost resin insulating layer (2MU) and the center of gravity of the printed wiring board. A resin insulating layer that is laminated at a position far from the center of gravity of the printed wiring board is likely to affect deformation of the printed wiring board. Therefore, although the shapes of the warpages are the same in the first embodiment and the second embodiment, the warpage amount of the printed wiring board of the second embodiment is smaller than the warpage amount of the printed wiring board of the first embodiment. Since the warpage amount is small, an electronic component such as an IC chip can be easily mounted on the printed wiring board of the second embodiment. An electrode of the electronic component and a pad of the printed wiring board for mounting the electronic component are connected by a joining member such as solder. However, stress does not concentrate on a particular joining member. The application example of the printed wiring board of the second embodiment can be easily mounted on a motherboard. The application example of the printed wiring board of the second embodiment and the motherboard are connected by a joining member such as solder. However, stress does not concentrate on a particular joining member.

The connection reliability between the printed wiring board of the second embodiment and the electronic component is higher than the connection reliability between the printed wiring board of the first embodiment and the electronic component. The connection reliability between the application example of the printed wiring board of the second embodiment and the motherboard is higher than the connection reliability between the application example of the printed wiring board of the first embodiment and the motherboard. The connection reliability is evaluated by a connection resistance value and the like after a heat cycle.

Third Embodiment

Figure 4:
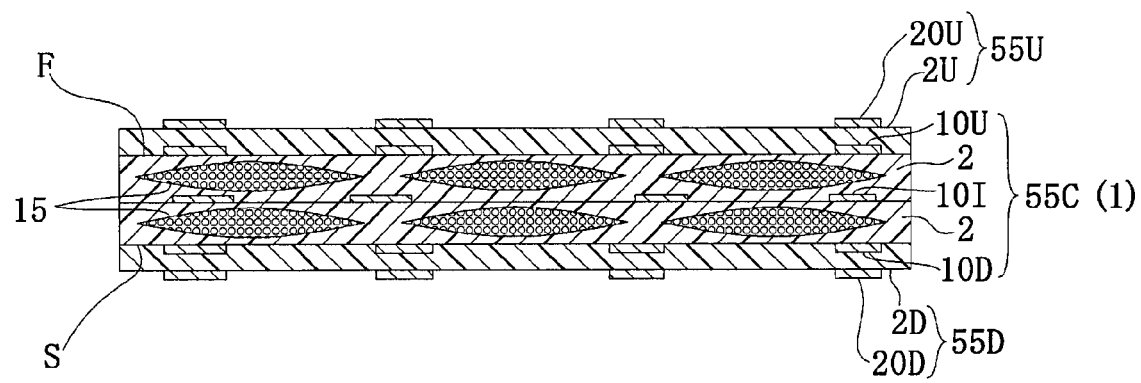
FIG. 4 illustrates a cross-sectional view of a printed wiring board of a third embodiment.

In the printed wiring boards of the first embodiment and the second embodiment, there is one resin insulating layer in the middle wiring part (55C). In contrast, as illustrated in FIG. 4, a middle wiring part (55C) of a third embodiment has multiple resin insulating layers (2, 2) and multiple conductor layers (10U, 10I, 10D). The resin insulating layers and the conductor layers are alternately laminated. Each of the resin insulating layers 2 has a reinforcing material. In the third embodiment, the core substrate 1 is formed by the resin insulating layers (2, 2) and the conductor layers (10U, 10I, 10D) that belong to the middle wiring part (55C). The conductor layer (10D) is a first middle conductor layer; the conductor layer (10I) is a third middle conductor layer; and the conductor layer (10U) is a second middle conductor layer. The core substrate 1 of the printed wiring boards of the first and second embodiments can be replaced with the core substrate (multilayer core substrate) 1 of the printed wiring board of the third embodiment. Therefore, the printed wiring board of the third embodiment has the same effects as the first embodiment and the second embodiment.

It is preferable that the resin insulating layers 2 of the middle wiring part (55C) of the third embodiment are formed of the same material. Similar to the first and second embodiments, in the third embodiment, the core substrate 1 is interposed between the upper wiring part (55U) and the lower wiring part (55D), and it is preferable that the number of the resin insulating layers contained in the upper wiring part (55U) and the number of the resin insulating layers contained in the lower wiring part (55D) are the same. Directions of warpages of the printed wiring board and the application example are controlled. The warpage amounts are reduced. The resin insulating layers 2 of the middle wiring part 55C may have a thickness of from 30 µm to 150 µm.

The first middle conductor layer (10D) and the second middle conductor layer (10U) of the core substrate 1 of the third embodiment may be connected by a through-hole conductor that penetrates through the core substrate 1, or may be connected by a via conductor that penetrates through the resin insulating layers 2 in the core substrate 1. An example of the former is illustrated, for example, in FIG. 17 of International Publication WO 2005/076683A1. The entire contents of WO 2005/076683A1 are incorporated herein by reference. An example of the latter is illustrated, for example, in FIG. 16 of International Publication WO 00/76281A1. The entire contents of WO 00/76281A1 are incorporated herein by reference. Further, the core substrate 1 of the third embodiment may be a substrate illustrated in FIG. 4 of Japanese Patent Laid-Open Publication JP 2005-327780A. In the substrate illustrated in FIG. 4 of JP 2005-327780A, a solder resist is formed. However, in the core substrate 1 of the third embodiment, a solder resist is not needed. A laminated body obtained by removing the solder resist from FIG. 4 of JP 2005-327780A is referred to as a coreless substrate.

Fourth Embodiment

A printed wiring board of a fourth embodiment is the same as the printed wiring board of the first embodiment. However, the application example of the first embodiment and an application example of the fourth embodiment are different in forms.

In the first-third embodiments, an electronic component such as a semiconductor element is mounted to the printed wiring board via a pad contained in the upper wiring part (55U), and the printed wiring board is amounted on a motherboard via a pad contained in the lower wiring part (55D). In contrast, in the fourth embodiment, an electronic component such as a semiconductor element is mounted to the printed wiring board via a pad contained in the lower wiring part (55D), and the printed wiring board is amounted on a motherboard via a pad contained in the upper wiring part (55U).

Figure 5A:
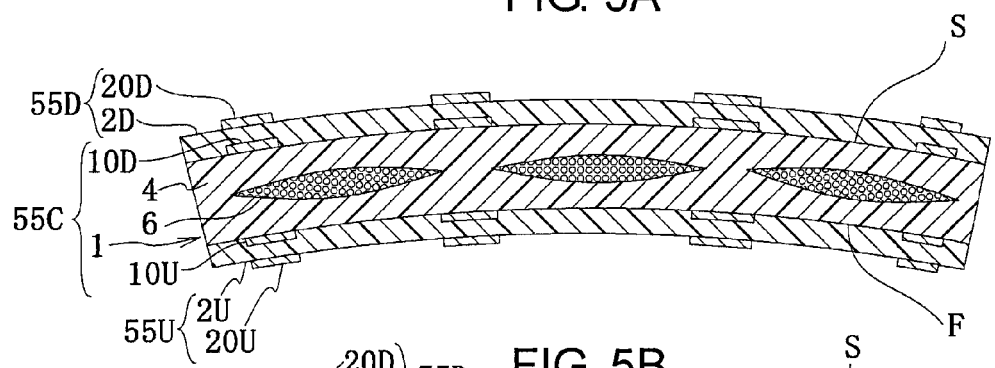
FIGS. 5A and 5B illustrate warpage of a printed wiring board of a fourth embodiment.
Figure 5B:
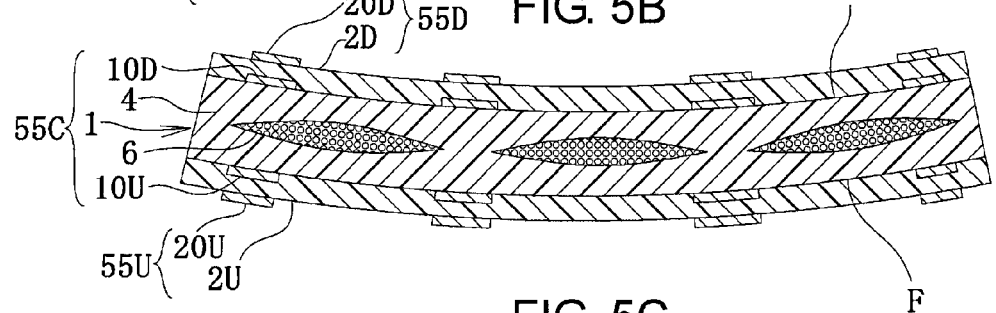

Schematic diagrams of warpages of the printed wiring board of the fourth embodiment are illustrated in FIGS. 5A and 5B. A Z-axis is illustrated in FIGS. 5A and 5B; a plus sign indicates an upper side and a minus sign indicates a lower side. In FIGS. 5A and 5B, the lower wiring part (55D) is illustrated on an upper side. In FIG. 5A, the direction of the warpage of the printed wiring board of the fourth embodiment at the normal temperature is illustrated. As illustrated in FIG. 5A, the printed wiring board of the fourth embodiment has convex warpage. FIG. 5B illustrates the direction of the warpage of the printed wiring board of the fourth embodiment at the reflow temperature (mounting temperature). At the mounting temperature, most of the printed wiring boards of the fourth embodiment have the warpage illustrated in FIG. 5B. Therefore, mounting of an electronic component becomes easy. In particular, when a large electronic component is mounted on the printed wiring board, distance between an electrode on outer periphery of the electronic component and a pad of the printed wiring board is short. A connection area between the electrode and solder, and a connection area between the pad and solder are large. Therefore, the connection reliability between the electronic component and the printed wiring board is improved.

For example, when 100 printed wiring boards of the fourth embodiment are manufactured, 90 or more of the printed wiring boards have concave warpages at the mounting temperature.

Figure 5C:
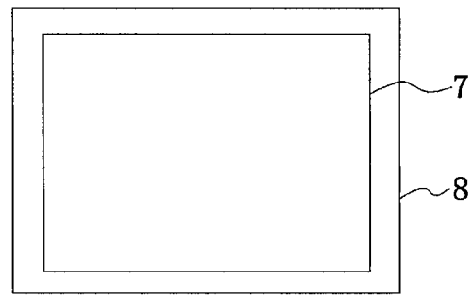
FIG. 5C illustrates a plan view illustrating an application example of the printed wiring board of the fourth embodiment.

FIG. 5C illustrates a plan view of an application example of the printed wiring board of the fourth embodiment. In FIG. 5C, an electronic component 7 such as a semiconductor element and a printed wiring board 8 are illustrated. In the plan view of FIG. 5C, for example, when a planar area of the printed wiring board 8 is 1, a planar area of the large electronic component 7 is 0.75 or more.

Fifth Embodiment

A printed wiring board of a fifth embodiment is the same as the printed wiring board of the second embodiment. However, the application example of the second embodiment and an application example of the fifth embodiment are different in forms.

In the first-third embodiments, an electronic component is mounted to the printed wiring board via a pad contained in the upper wiring part (55U), and the printed wiring board is amounted on a motherboard via a pad contained in the lower wiring part (55D). In contrast, in the fifth embodiment, an electronic component is mounted to the printed wiring board via a pad contained in the lower wiring part (55D), and the printed wiring board is amounted on a motherboard via a pad contained in the upper wiring part (55U).

Similar to the printed wiring board of the second embodiment, for the printed wiring board of the fifth embodiment, the direction of the warpage can be controlled. Most of the printed wiring boards of the fifth embodiment have convex warpage at the normal temperature and have concave warpage at the mounting temperature. Further, similar to the printed wiring board of the second embodiment, for the printed wiring board of the fifth embodiment, the warpage amount is small. Therefore, yield for mounting electronic components on the printed wiring boards of the fifth embodiment is increased. Further, the connection reliability between the electronic component and the printed wiring board is improved.

Sixth Embodiment

A printed wiring board of a sixth embodiment is the same as the printed wiring board of the third embodiment. However, the application example of the third embodiment and an application example of the sixth embodiment are different in forms.

In the first-third embodiments, an electronic component is mounted to the printed wiring board via a pad contained in the upper wiring part (55U), and the printed wiring board is amounted on a motherboard via a pad contained in the lower wiring part (55D). In contrast, in the sixth embodiment, an electronic component is mounted to the printed wiring board via a pad contained in the lower wiring part (55D), and the printed wiring board is amounted on a motherboard via a pad contained in the upper wiring part (55U).

Similar to the printed wiring board of the third embodiment, for the printed wiring board of the sixth embodiment, the direction of the warpage can be controlled. Most of the printed wiring boards of the sixth embodiment have convex warpage at the normal temperature and have concave warpage at the mounting temperature. Further, similar to the third embodiment, the core substrate 1 of the printed wiring board of the sixth embodiment is a multilayer core substrate and thus, rigidity of the core substrate 1 is high. Therefore, similar to the printed wiring board of the third embodiment, for the printed wiring board of the sixth embodiment, the warpage amount is small. Therefore, yield for mounting electronic components on the printed wiring boards of the sixth embodiment is increased. Further, the connection reliability between the electronic component and the printed wiring board is improved.

The printed wiring board of the each of the embodiments may have an upper solder resist layer for exposing a pad on the upper wiring part (55U). Further, the printed wiring board of the each of the embodiments may have a lower solder resist layer for exposing a pad on the lower wiring part (55D).

Figure 6A:
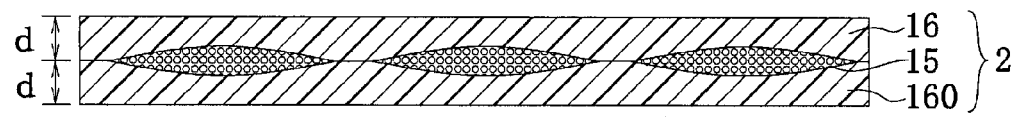
FIGS. 6A and 6B illustrate cross-sectional views illustrating examples of cross sections of resin insulating layers that are used in the embodiments.
Figure 6B:
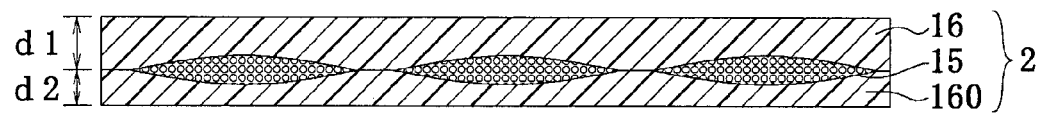

Examples of cross sections of resin insulating layers used in each of the embodiments are illustrated in FIGS. 6A and 6B.

Figure 7:
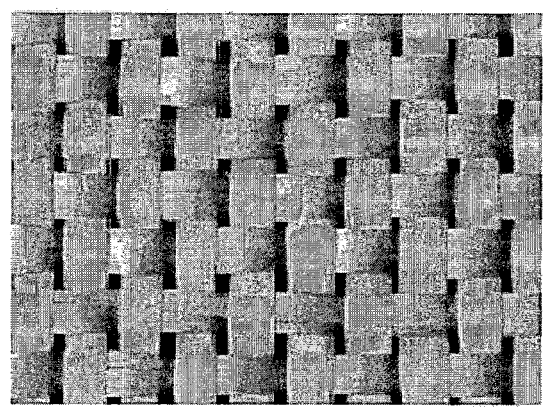
FIG. 7 illustrates a plan view illustrating a glass cloth as a reinforcing material.

A resin insulating layer 2 illustrated in FIG. 6A is formed by a reinforcing material 15 such as a glass cloth, and resin layers (16, 160) that sandwich the glass cloth. In FIG. 6A, the resin layers (16, 160) that sandwich the reinforcing material 15 have the same thickness (d). With the reinforcing material 15 such as a glass cloth remaining the same, by changing the thickness (d) of the resin layers (16, 160), the amount (vol %) of resin contained in the resin insulating layer can be changed. A plan view of a glass cloth as the reinforcing material 15 is illustrated in FIG. 7.

In the resin insulating layer illustrated in FIG. 6B, a thickness (d1) of a resin layer 16 on one side of a reinforcing material 15 and a thickness (d2) of a resin layer 160 on the other side of the reinforcing material 15 are different. The resin layer 16 is a first resin layer, and the resin layer 160 is a second resin layer.

To improve connection reliability between a printed wiring board and a substrate mounted on the printed wiring board, the heights of bumps may be set according to sizes of warpages of the printed wiring board and the substrate. However, the size of the warpage of the printed wiring board may change depending on a size of the printed wiring board. Therefore, it may be difficult to predict a warpage amount of the printed wiring board for improving the connection reliability between the printed wiring board and the substrate mounted on the printed wiring board.

A volume of the conductor may be adjusted by dummy pattern. However, since micro-fabrication of conductor circuits has advanced, it is expected to be difficult to form a dummy pattern on a printed wiring board.

A printed wiring board according to an embodiment of the present invention reduces an amount of warpage in the printed wiring board. A printed wiring board according to an embodiment of the present invention controls a direction of the warpage of the printed wiring board. A printed wiring board according to an embodiment of the present invention improves connection reliability between an IC chip and the printed wiring board and connection reliability between a motherboard and the printed wiring board.

A printed wiring board according to an embodiment of the present invention has a lower wiring part that includes a lower conductor layer, and a lower resin insulating layer that is formed on the lower conductor layer; a middle wiring part that includes a first middle conductor layer, a middle resin insulating layer that is formed on the first middle conductor layer, and a second middle conductor layer that is formed on the middle resin insulating layer; and an upper wiring part that includes an upper resin insulating layer, and an upper conductor layer that is formed on the upper resin insulating layer. The resin insulating layers and the conductor layers are alternately laminated. The middle wiring part is interposed between the upper wiring part and the lower wiring part. A vol % of resin contained in the upper resin insulating layer is larger than a vol % of resin contained in the lower resin insulating layer, and a difference between the vol % of resin ranges from 0.5% to 5.0%.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a core substrate comprising a resin insulating layer and a plurality of conductor layers;
   a first wiring structure formed on a first surface of the core substrate and comprising a conductor layer and a resin insulating layer such that the conductor layer in the first wiring structure includes a plurality of pads positioned to mount an electronic component on the first wiring structure; and
   a second wiring structure formed on a second surface of the core substrate and comprising a conductor layer and a resin insulating layer such that the conductor layer in the second wiring structure includes a plurality of pads positioned to mount a mother board to the second wiring structure,
   wherein the core substrate is interposed between the first wiring structure and the second wiring structure such that the resin insulating layers and conductor layers in the core substrate, first wiring structure and second wiring structure are alternately laminated, the resin insulating layer in the first wiring structure has a vol % of resin which is larger than a vol % of resin in the resin insulating layer in the second wiring structure such that a difference in the vol % of resin in the first and second wiring structures is in a range of from 0.5% to 5.0% and that a coefficient of thermal expansion of the resin insulating layer in the first wiring structure is larger than a coefficient of thermal expansion of the resin insulating layer in the second wiring structure, the resin insulating layer in the core substrate comprises a first resin layer and a second resin layer such that the first resin layer has a thickness which is substantially equal to a thickness of the second resin layer, the first wiring structure includes an outermost resin insulating layer and an outermost conductor layer formed on the outermost resin insulating layer, the outermost conductor layer in the first wiring structure includes the plurality of pads positioned to mount the electronic component on the first wiring structure, and the coefficient of thermal expansion of the resin insulating layer in the first wiring structure is larger than the coefficient of thermal expansion of the resin insulating layer in the second wiring structure within the difference in the vol % of resin in the range of from 0.5% to 5.0% such that the printed wiring board forms a convex warpage with respect to a mounting surface of the first wiring structure at a mounting temperature of the electronic component.

2. A printed wiring board according to claim 1, wherein the second wiring structure includes an outermost resin insulating layer and an outermost conductor layer formed on the outermost resin insulating layer, and the outermost resin insulating layer in the first wiring structure has a vol % of resin which is substantially equal to a vol % of resin in the outermost resin insulating layer in the second wiring structure.

3. A printed wiring board according to claim 2, wherein the resin insulating layer in the core substrate comprises the first resin layer, the second resin layer and a reinforcing material interposed between the first resin layer and the second resin layer.

4. A printed wiring board according to claim 3, wherein the outermost conductor layer in the second wiring structure includes the plurality of pads positioned to mount the mother board on the second wiring structure.

5. A printed wiring board according to claim 2, wherein the resin insulating layer in the core substrate comprises the first resin layer and the second resin layer such that the first resin layer and the second resin layer are interposed between the conductor layers in the core substrate.

6. A printed wiring board according to claim 5, wherein the resin insulating layer in the core substrate comprises the first resin layer and the second resin layer, and each of the first resin layer and the second resin layer includes a reinforcing material.

7. A printed wiring board according to claim 5, wherein the outermost conductor layer in the second wiring structure includes the plurality of pads positioned to mount the mother board on the second wiring structure.

8. A printed wiring board according to claim 2, wherein the outermost conductor layer in the second wiring structure includes the plurality of pads positioned to mount the mother board on the second wiring structure.

9. A printed wiring board according to claim 2, wherein the resin insulating layers in the first and second wiring structures include at least one of an inorganic particle material and a reinforcing material in amounts adjusted such that the resin insulating layer in the first wiring structure has the vol % of resin which becomes larger than the vol % of resin in the resin insulating layer in the second wiring structure and that the difference in the vol % of resin in the first and second wiring structures is in the range of from 0.5% to 5.0%.

10. A printed wiring board according to claim 2, wherein the resin insulating layers in the first and second wiring structures have thicknesses adjusted such that the resin insulating layer in the first wiring structure has the vol % of resin which becomes larger than the vol % of resin in the resin insulating layer in the second wiring structure and that the difference in the vol % of resin in the first and second wiring structures is in the range of from 0.5% to 5.0%.

11. A printed wiring board according to claim 2, wherein the resin insulating layer in the first wiring structure has a thickness which is greater than a thickness of the resin insulating layer in the second wiring structure such that the resin insulating layer in the first wiring structure has the vol % of resin which becomes larger than the vol % of resin in the resin insulating layer in the second wiring structure and that the difference in the vol % of resin in the first and second wiring structures is in the range of from 0.5% to 5.0%.

12. A printed wiring board according to claim 2, wherein the resin insulating layers in the first wiring structure and second wiring structure comprise a thermosetting resin material.

13. A printed wiring board according to claim 1, wherein the resin insulating layer in the core substrate comprises the first resin layer, the second resin layer and a reinforcing material interposed between the first resin layer and the second resin layer.

14. A printed wiring board according to claim 1, wherein the resin insulating layer in the core substrate comprises the first resin layer and the second resin layer such that the first resin layer and the second resin layer are interposed between the conductor layers in the core substrate.

15. A printed wiring board according to claim 14, wherein the resin insulating layer in the core substrate comprises the first resin layer and the second resin layer, and each of the first resin layer and the second resin layer includes a reinforcing material.

16. A printed wiring board according to claim 1, wherein the resin insulating layer in at least one of the first wiring structure and the second wiring structure includes an inorganic particle material.

17. A printed wiring board according to claim 1, wherein the resin insulating layers in the first wiring structure and second wiring structure comprise a thermosetting resin material.

18. A printed wiring board according to claim 1, wherein the resin insulating layers in the first and second wiring structures include at least one of an inorganic particle material and a reinforcing material in amounts adjusted such that the resin insulating layer in the first wiring structure has the vol % of resin which becomes larger than the vol % of resin in the resin insulating layer in the second wiring structure and that the difference in the vol % of resin in the first and second wiring structures is in the range of from 0.5% to 5.0%.

19. A printed wiring board according to claim 1, wherein the resin insulating layers in the first and second wiring structures have thicknesses adjusted such that the resin insulating layer in the first wiring structure has the vol % of resin which becomes larger than the vol % of resin in the resin insulating layer in the second wiring structure and that the difference in the vol % of resin in the first and second wiring structures is in the range of from 0.5% to 5.0%.

20. A printed wiring board according to claim 1, wherein the resin insulating layer in the first wiring structure has a thickness which is greater than a thickness of the resin insulating layer in the second wiring structure such that the resin insulating layer in the first wiring structure has the vol % of resin which becomes larger than the vol % of resin in the resin insulating layer in the second wiring structure and that the difference in the vol % of resin in the first and second wiring structures is in the range of from 0.5% to 5.0%.

* * * * *